United States Patent
Huang

(10) Patent No.: US 6,384,472 B1
(45) Date of Patent: May 7, 2002

(54) LEADLESS IMAGE SENSOR PACKAGE STRUCTURE AND METHOD FOR MAKING THE SAME

(75) Inventor: Chien-Ping Huang, Hsinchu Hsien (TW)

(73) Assignee: Siliconware Precision Industries Co., LTD, Taichung Hsien (TW)

( * ) Notice: Subject to any disclaimer, the term of this patent is extended or adjusted under 35 U.S.C. 154(b) by 0 days.

(21) Appl. No.: 09/535,499

(22) Filed: Mar. 24, 2000

(51) Int. Cl.[7] .................. H01L 23/02; H01L 23/22; H01L 23/48; H01L 23/04; H01L 23/29
(52) U.S. Cl. ............... 257/680; 257/676; 257/687; 257/690; 257/730; 257/789; 257/793; 257/795
(58) Field of Search ................. 257/680, 681, 257/682, 687, 690, 729, 730, 788, 789, 793, 795, 676

(56) References Cited

U.S. PATENT DOCUMENTS

| | | | | |
|---|---|---|---|---|
| 4,710,797 A | * | 12/1987 | Tanaka | |
| 4,769,344 A | * | 9/1988 | Sakai et al. | |
| 5,037,779 A | * | 8/1991 | Whalley et al. | |
| 5,343,076 A | * | 8/1994 | Katayama et al. | 257/717 |
| 6,194,251 B1 | * | 2/2001 | Ahmad | 438/127 |
| 6,274,927 B1 | * | 8/2001 | Glenn | 257/680 |

FOREIGN PATENT DOCUMENTS

| | | | | |
|---|---|---|---|---|
| JP | 2-184071 | * | 7/1990 | 257/680 |
| JP | 5-6943 | * | 1/1993 | 257/680 |

* cited by examiner

Primary Examiner—Ngân V. Ngô
(74) Attorney, Agent, or Firm—J. C. Patents

(57) ABSTRACT

A leadless image sensor package constructed on a lead frame includes a die pad and a plurality of leads disposed at the periphery of the die pad. A molding compound, disposed on the top surface of the lead frame and being surrounding the die pad on the periphery of the lead frame, fills the clearance between the die pad and the leads and exposes, on the top surface, the die pad and the wire-bonding portion of the leads. Moreover, the lead frame and the molding compound constitute a "chip containing space" with chip set therein. Further, the chip with its back surface attached to the top surface of the die pad makes use of the wires to electrically connect to the bonding pad and the top surface of the wire-bonding portion, thereafter, a transparent lid is used to cap and seal the "chip containing space".

15 Claims, 7 Drawing Sheets

LEADLESS IMAGE SENSOR PACKAGE STRUCTURE AND METHOD FOR MAKING THE SAME

BACKGROUND OF THE INVENTION

1. Field of the Invention

This invention relates to an image sensor package structure and method for making the same, and more particularly to a leadless image sensor package structure and method for making the same.

2. Description of Related Art

As the development of multimedia is flourishing recently, the use of digital image has been more and more frequent, consequently, the corresponding requirements for image process devices are increasing. Many digital image products used nowadays including video camera, PC digital video camera, and even optical scanner and visual telephone etc. acquire images by the use of image sensor. The image sensor including Charge Coupled Device (CCD) and Complementary Metal-Oxide Semiconductor (CMOS) sensor etc. can sensitively receive light beam transmitted by the image and convert into digital signal. Since image sensor needs to receive light source, its package type is quite different from that of any common electronic product.

Conventional image sensor package employs Plastic Quad Flat Package (PQFP) as the package structures disclosed in U.S. Pat. No. 5,523,608 and U.S. Pat. No. 5,529,959. But because of their relatively good size, they are not adequate for the trend of high integration in the near future. Besides, a lot of conventional image sensors employ ceramic carrier such as ceramic Leadless Chip Carrier (LCC) as disclosed in U.S. Pat. No. 5,898,218 and U.S. Pat. No. 5,270,491. Although the ceramic carrier having feature of relatively good in sealing can prolong the service life of the image device, it can't meet the demand in the market. This is because that ceramic carrier is high in manufacturing cost and is tedious and complicated in manufacturing process. There is another kind of plastic package with its carrier that makes use of laminated substrate to form a type similar to a leadless carrier as disclosed in U.S. Pat. No. 5,811,799. Although this kind of package can reduce its size, the carrier of the package makes of such material as flame-retardant epoxy glass fabric composite resin, e.g. FR-4, FR-5, or Bismaleimide-Triazine (BT). As these kinds of material are relatively high in cost, this kind of package can't meet the requirements of the market demand either.

SUMMARY OF THE INVENTION

The invention is directed to an improved leadless image sensor package that can significantly lower the cost by using lead frame and mold packaging material to form a carrier.

The invention is also directed to an improved leadless package structure that can provide compact package so as to increase package density.

The invention is further directed to an improved method of making a leadless package structure that is simple in manufacturing process so as to increase the production yield and to adapt to mass production.

A leadless image sensor package constructed on a lead frame includes a die pad and a plurality of leads disposed at the periphery of the die pad. A molding compound, disposed on the top surface of the lead frame and being surrounding the die pad on the periphery of the lead frame, fills the clearance between the die pad and the leads and exposes, on the top surface, the die pad and the wire-bonding portion of the leads. Moreover, the lead frame and the molding compound constitute a "chip containing space" with chip set therein. Further, the chip with its back surface attached to the top surface of the die pad makes use of the wires to electrically connect to the bonding pad and the top surface of the wire-bonding portion, thereafter, a transparent lid is used to cap and seal the "chip containing space".

In the light of the foregoing leadless image sensor package structure, the invention also provides a corresponding method for making the same. The method includes: providing a lead frame, having a plurality of package units, each of the units includes at least a die pad and a plurality of leads disposed at the periphery of the die pad; performing a molding process to form a molding compound on the first surface of the lead frame and being surrounding the outer edge of the lead frame, filling the clearance between the die pad and the wire-bonding portion of the leads, as well as exposing, on the first surface, the die pad and the wire-bonding portion of the leads, thus, to make the lead frame and the molding compound form a "chip containing space" in each of the package unit; performing a chip attaching process to set the chips in the "chip containing space" to attach, with the back surface of the chip, to the first surface of the corresponding die pad ; performing a wire-bonding process by the use of a plurality of wires, to electrically connect respectively to the bonding pads and the top surface of the wire-bonding portion; performing a sealing process to seal respectively the "chip containing spaces" by a transparent material; and performing a singulating process to separate the package units.

In accordance with an embodiment of the invention, on the bottom surface, a stepped structure is built at the wire-bonding portion of the leads and at the periphery of the die pad such that the molding compound covers a relatively thinner portion on the bottom surface, or the die pad can be designed in such a way that its thickness is thinner that of the leads to make the molding compound cover the bottom surface of the die pad so as to enhance the bondability between the lead frame and the molding compound. In the molding process, the top mold clamps the top surface of the die pad and the wire-bonding portion while the bottom surface clamps the whole bottom surface to prevent the residual "flash" in order to increase the product's reliability and simplify the fabrication process.

Moreover, the transparent lid disposed at the top end of the "chip containing space" and fixed to the molding compound, can be a transparent glass plate or a transparent plastic plate. The transparent lid can also be a transparent liquid material to be filled in the "chip containing space" and gone through a curing process to complete the package molding process. An array type is used for the package units to tightly dispose them together and to make them adjacent one another, and a punching method is employed to separate the package units. Besides, a strip type of disposition can also be employed and a constant space is kept. And for singulating process, a punching method is also employed to separate the package units.

Since the package structure of the invention directly uses the bottom surface of the lead to be the external electrical connection to form a leadless structure, the package structure can increase the package density. Besides, since the package structure of the invention uses lead frame and molding compound to form a carrier, thereby, the package structure of the invention can significantly lower the product's cost and facilitate a mass production.

BRIEF DESCRIPTION OF DRAWINGS

The foregoing and other objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1:
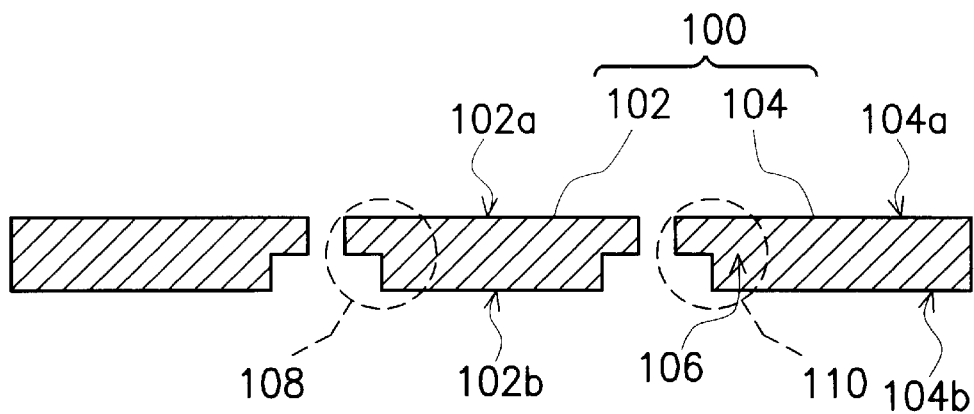
FIG. 1 through FIG. 5 is cross-sectional view of a manufacturing process of a leadless image sensor package structure according to the invention.

FIG. 1 through FIG. 5 are cross-sectional views of a manufacturing process of a leadless image sensor package structure according to the invention. The leadless image sensor package structure of the invention is constructed on a lead frame 100 that includes a die pad 102 and a plurality of leads 104 disposed at the periphery of the die pad 102 and surrounding thereof. In this embodiment, the die pad 102 has a top surface 102a larger than its bottom surface 102b and a top surface 104a of the lead 104 is also larger than its bottom surface 104b. Therefore, a step-like structure 108 or 110 is formed at the periphery of the die pad 102 and at the wire-bonding portion 106 of the leads 104. The step-like structures 108 and 110 are formed by a "half etching method" or a "coining method" so that the thickness of a portion of the step-like structure 108, 110 can be reduced. The step-like structure s 108 and 110 are used to improve bondability between the lead frame 100 and a below-mentioned molding compound 124.

Figure 2:
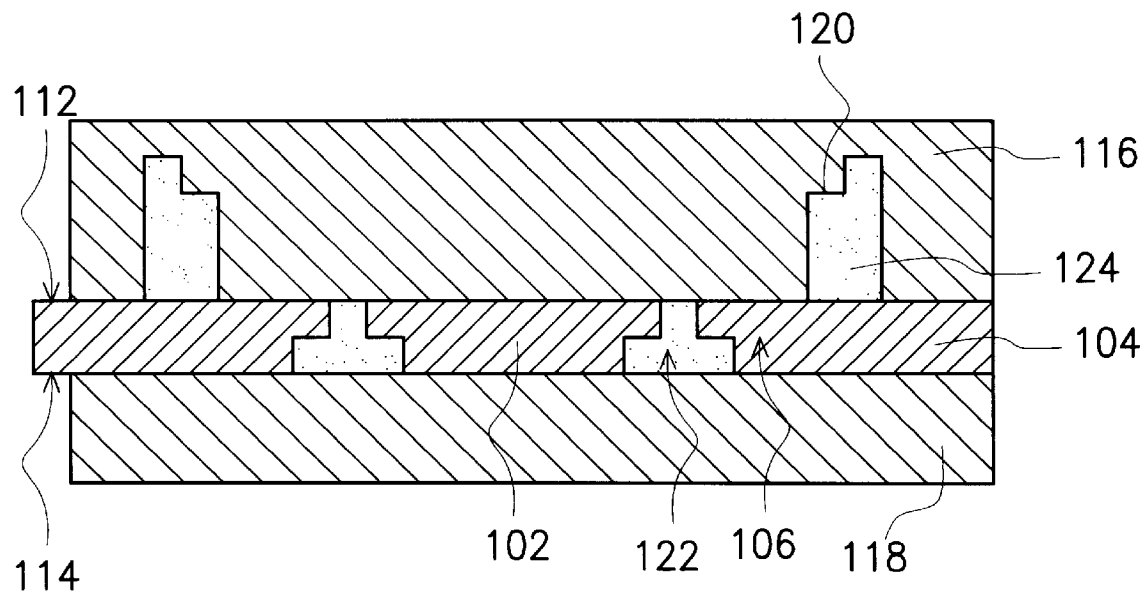

Subsequently, as shown in FIG. 2, a molding process is performed to form sidewall of the package. In the molding process, the lead frame 100 is set in a mold to be clamped by a top mold 116 and a bottom mold 118. The top mold 116 is an "insert mold" type that clamps the die pad 102 and the wire-bonding portion 106 on the first surface 112 (top surface) while the bottom mold 118 clamps the whole second surface 114 (bottom surface). A mold cavity 120 is disposed at the outer edge of the lead 104, and the molding compound 124 is filled through the cavity 120, into the gaps between the leads 104 as well as into the clearance 122 between the leads 104 and the die pad 102. The material such as epoxy employed for the molding compound 124 can lower the material cost. It is worth mentioning that in the premolding process for forming the carrier of the conventional plastic image sensor package, owing to the mold pressure, "flash phenomenon" often occurs in the wire-bonding portion 106 and on the upper surface of the die pad 102. As a result, a cleaning process is needed lest it results in the difficulty of attaching the die in the subsequent process and the inability that the wire is not electrically connected to the lead in the wire-bonding process, consequently, the production yield and reliability become lower. This kind of "flash phenomenon" can be avoided in the invention since the die pad 102 and the wire-bonding portion 106 are both clamped by the top mold 116 and the bottom mold 118, thereby, the production yield and the product reliability can be greatly improved.

Figure 3:
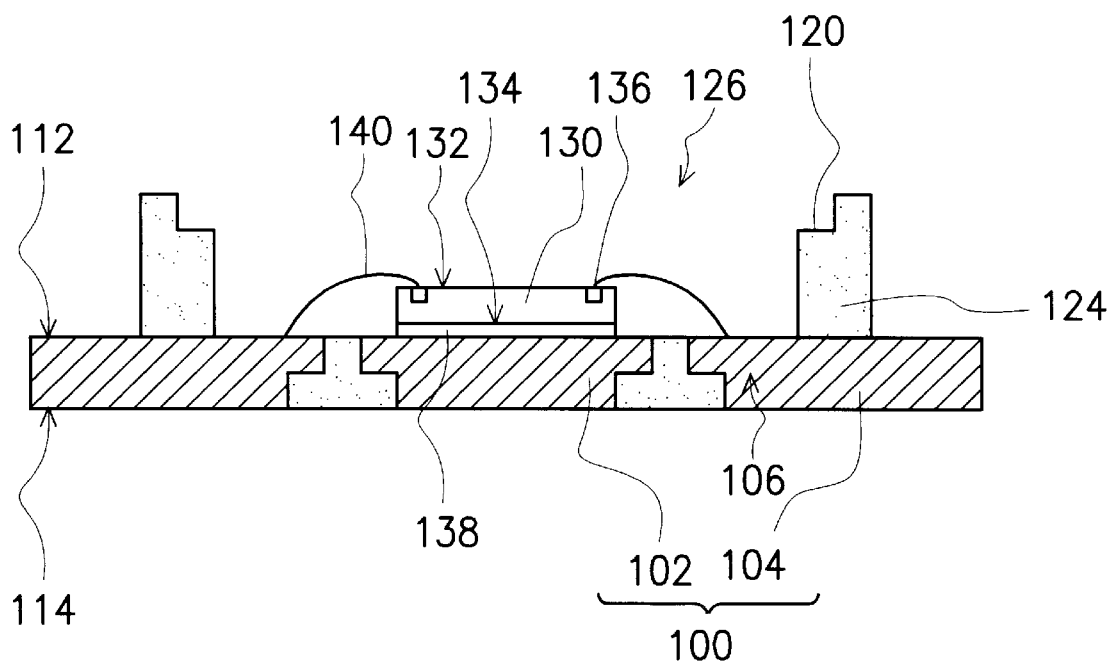

As shown in FIG. 3, a "chip containing space" 126 is constituted by the sidewall that is formed by the molding compound 124, and the lead frame 100. A die attaching process is then performed to set a chip 130 in the "chip containing space" 126 (see FIG. 4). Next, the chip 130 is having its back surface 134 adhere to the first surface 112 of the die pad 102 while the active surface 132 of the chip 130 is facing toward the opening of the "chip containing space" 126. A wire-bonding process is then followed to have the bonding pads 136 on the active 132 electrically connected to the wire-bonding portion 106 of the leads 104 by making use of the wire 140.

Figure 4:
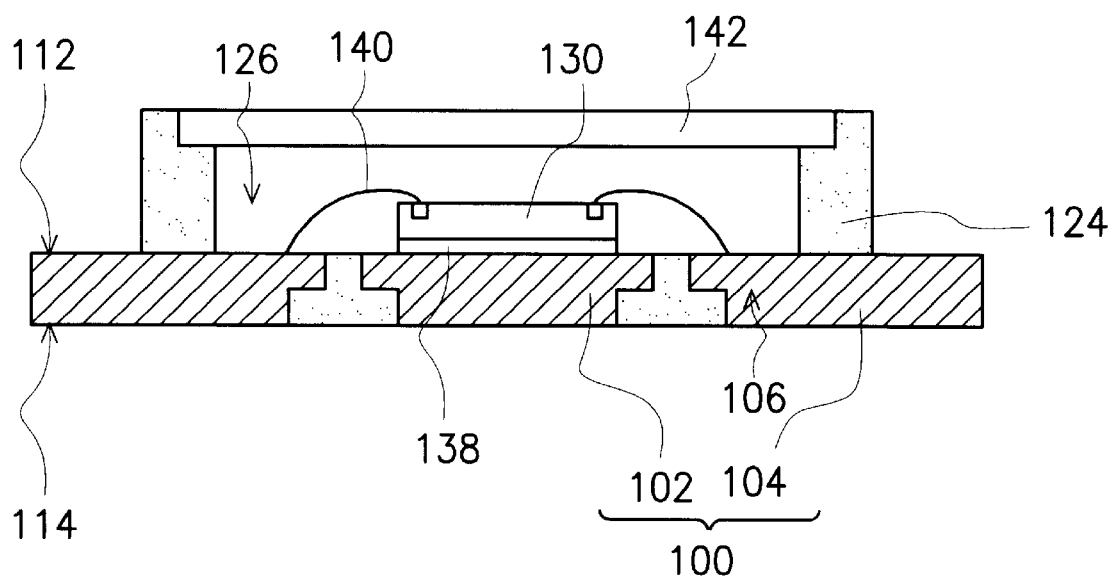

Referring to FIG. 4, a sealing process is performed to ejected air from the "chip containing space" 126. The opening of the "chip containing space" 126 is then capped and sealed by a "transparent lid 142" that is fixed to the top surface of the molding compound 124 by the use of an adhesive. The material employed for the "tansparent lid 142" can be a transparent glass plate or a transparent plastic plate, or even a lens that can increase its focusing power.

Figure 5:
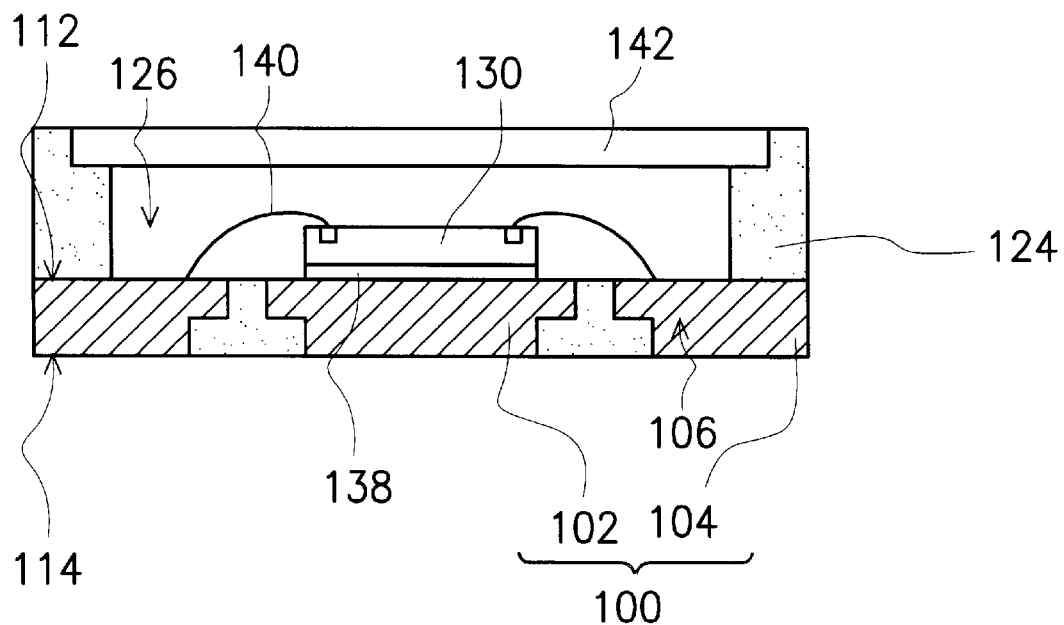

Referring to FIG. 5, a singulating process is performed to cut off the unnecessary portion of the lead frame 100 so that the edge of the leads are lined up with the molding compound 124 to make the package become a leadless one. At this point, the leadless image sensor package uses the second surface 114 (bottom surface) of the lead 104 as external electrical connection.

Although there is stepped structural design in the above-mentioned embodiment, the leadless image sensor package of the invention is not limited to this design, and some modifications as required are intended to cover in the scope of the invention.

Figure 6:
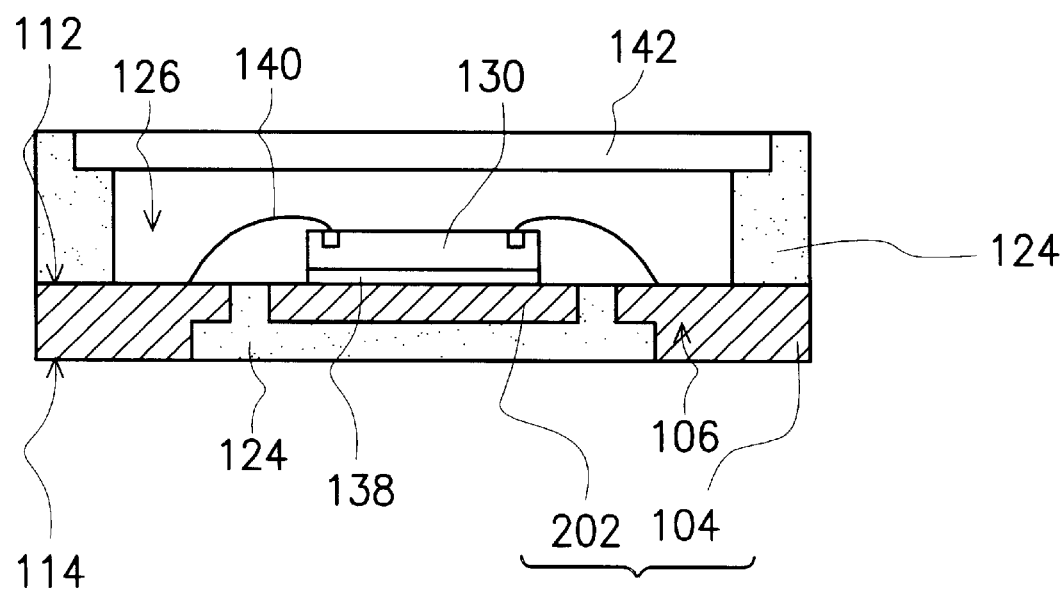
FIG. 6 is another die pad design of a leadless image sensor package according to the invention.

Referring to FIG. 6, it is another die pad design of a leadless image sensor package according to the invention. In order to further enhance the boundability between the molding compound 124 and the lead frame 100, the die pad 102 can be designed having its thickness thinner than that of the lead 104. In this way, the molding compound can well cover the bottom surface 114 of the die pad 102.

Figure 7:
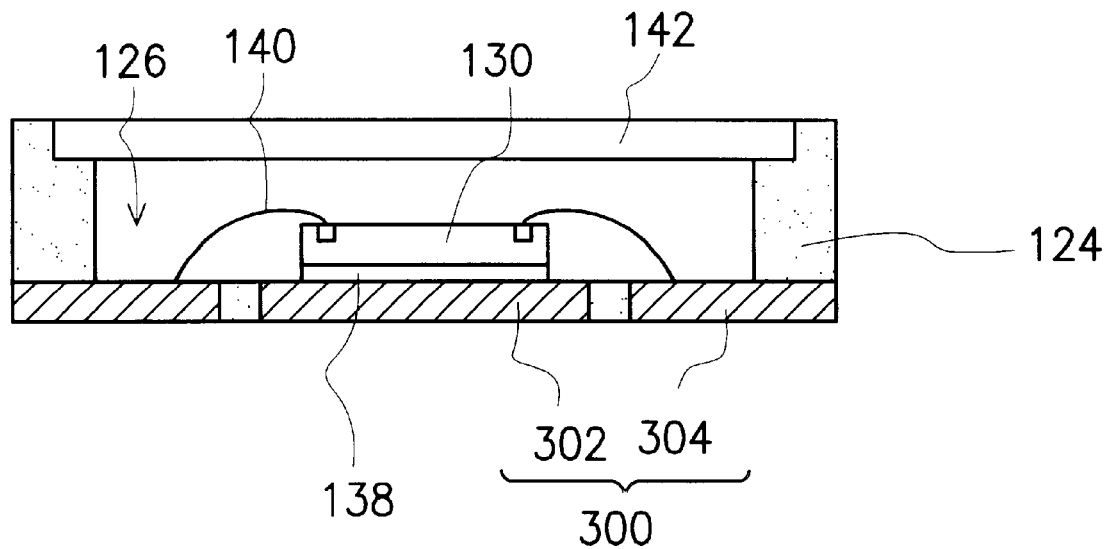
FIG. 7 is another lead frame design of a leadless image sensor package according to the invention.

Referring to FIG. 7, it is another lead frame design of a leadless image sensor package according to the invention. It is not necessary to have any particular structural design for the lead frame if appropriate material is selected and proper plating treatment is performed to improve the boundability of the molding compound. As shown in FIG. 7, there is neither any special structural design for the die pad 302 in the lead frame 300 nor for the leads 304, but the die pad 302 and the leads 304 can still be constituted to become the leadless image sensor package of the invention.

Figure 8:
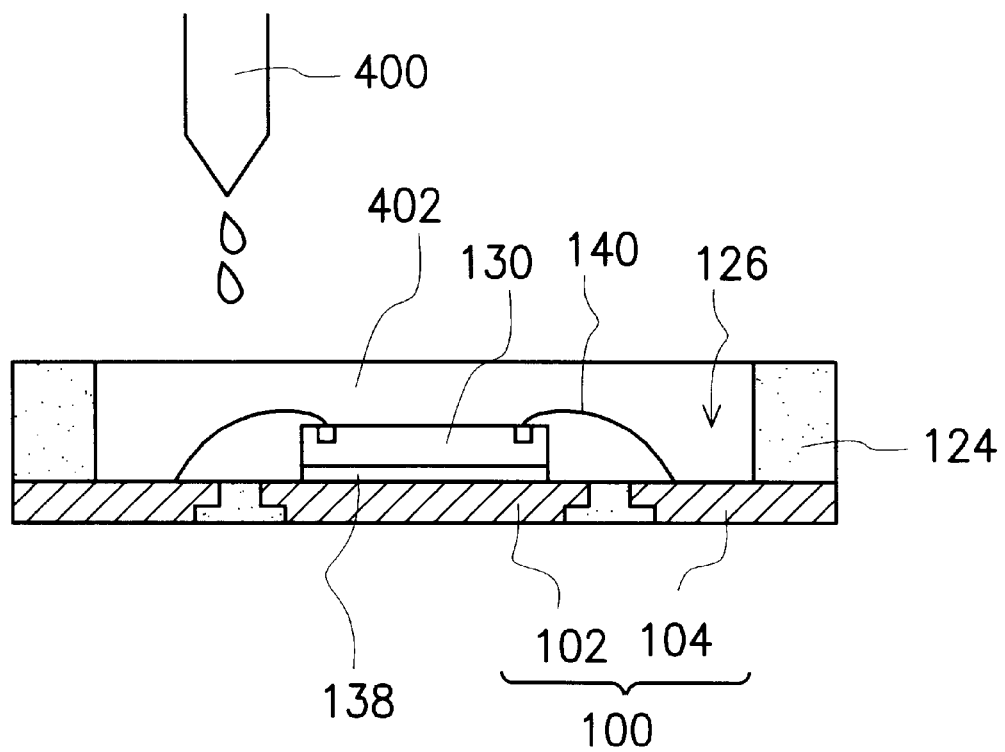
FIG. 8 is another sealing structure and its fabricating method of a leadless image sensor package according to the invention.

Referring to FIG. 8, it is another lead frame design of a leadless image sensor package according to the invention. In addition to the transparent glass plate or transparent plastic plate employed for the sealing process of the invention, a transparent liquid material can be used as another alternative. As shown in FIG. 8, after the chip attachment and wire-bonding processes are accomplished, a transparent liquid material 402 is filled into the "chip containing space" 126 to form the transparent lid. The transparent liquid material that includes liquid glass or liquid gel normally contains solvent hence it needs to be heated to make it curing, but the dispensing work can be performed in an appropriate vacuum environment.

Figure 9:
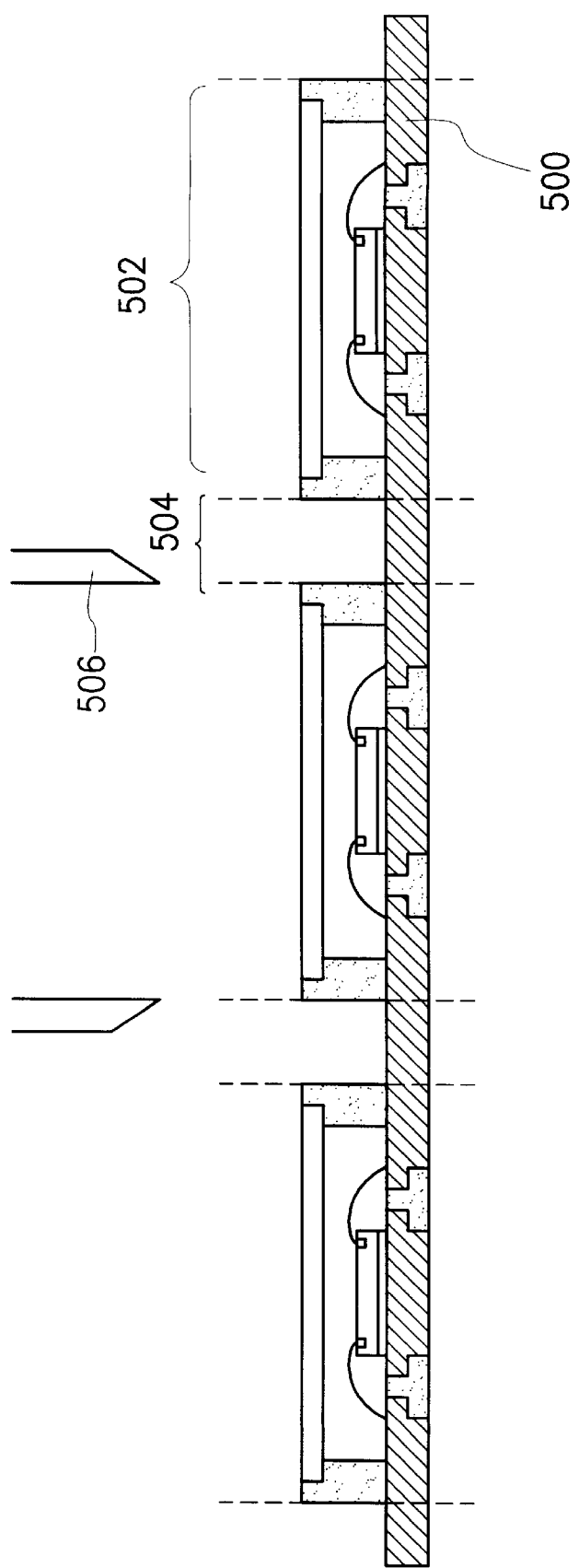
FIG. 9 is a mass production structure of a leadless image sensor package according to the invention.

Referring to FIG. 9, it is a mass production structure of a leadless image sensor package according to the invention. The foregoing embodiments are illustrated by means of a single package unit. But for facilitating packaging automation, a package having a lead frame including a multiplicity of package units is adopted for performing packaging with a multiplicity of chips at the same time. As shown in FIG. 9, a lead frame 500 having a multiplicity of package units 502 is in strip type disposition wherein a constant space 504 is kept to facilitate production automation. In this type of package structure, a singulating process is performed in "punch out method" to separate lead frames one by one from the package unit 502 by the use of a punch 506.

Figure 10:
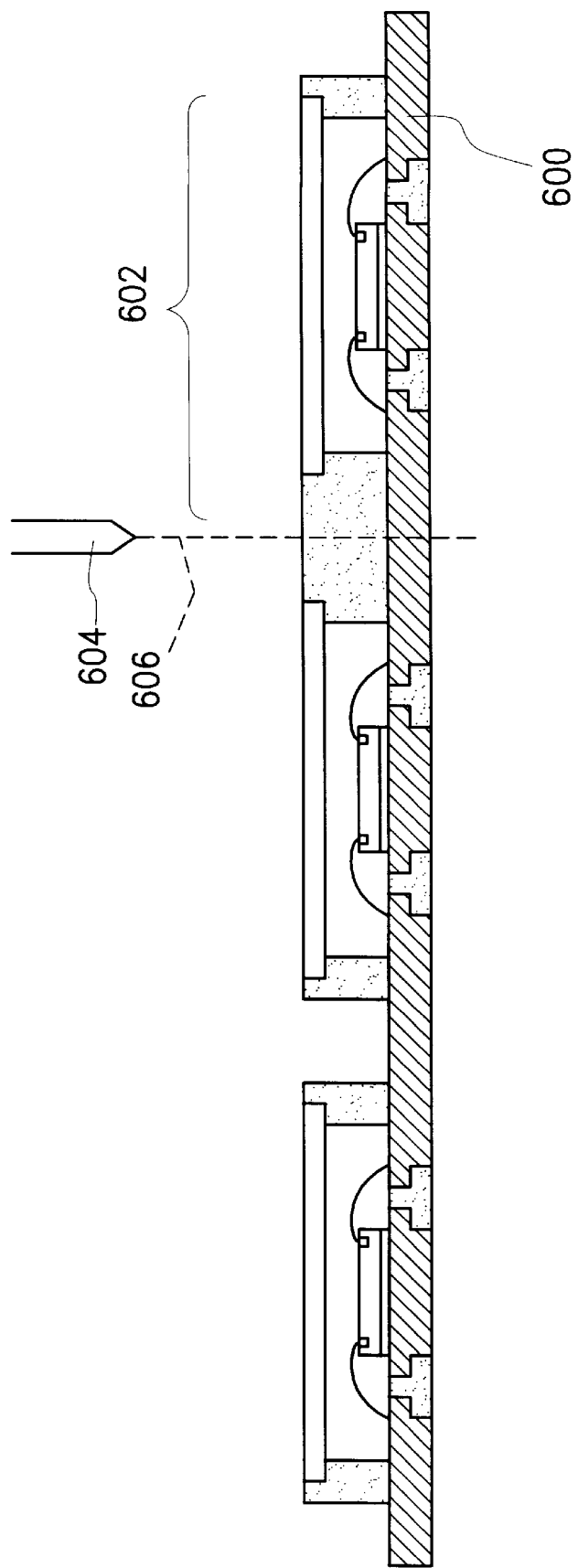
FIG. 10 is another mass production structure of a leadless image sensor package according to the invention.

Referring to FIG. 10, it is another mass production structure of a leadless image sensor package according to the invention. As shown in FIG. 10, an array type disposition is adopted to tightly dispose a multiplicity of package units 602 on a lead frame 600 with a multiplicity of package units 602 performed at the same time in a molding process. As for the subsequence singulating process, a sawing method is adopted to use a saw 604 or laser to cut along the scribe line 606 to separate the package unit. As this type of mass production structure being very compact in the disposition for the packaging units makes the most of the material, the structure is able to lower the cost thereby, is appropriate for mass production.

Figure 11:
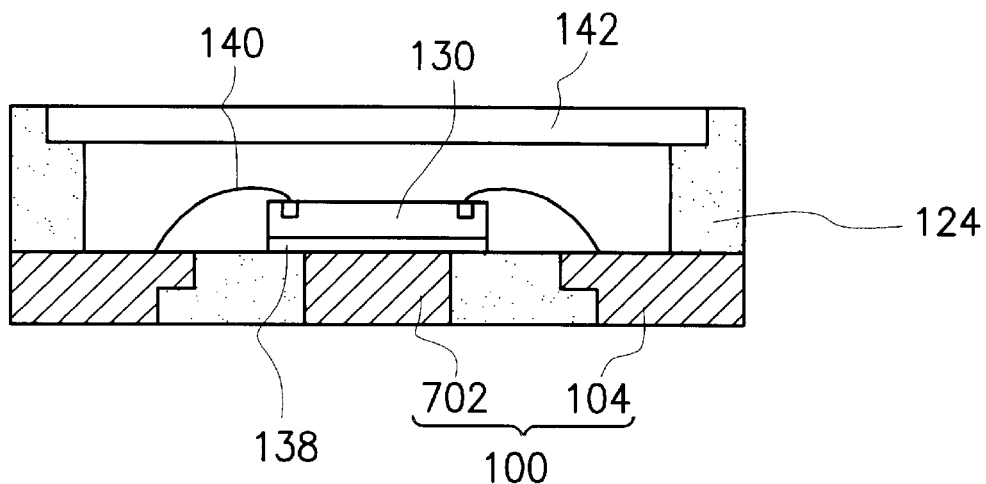
FIG. 11 and FIG. 12 show another die pad design of a lead frame according to the invention.
Figure 12:
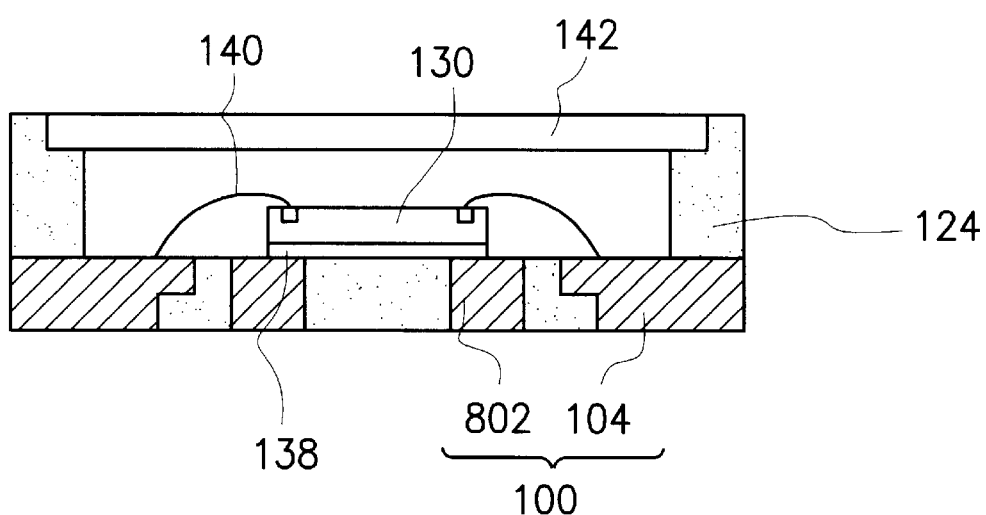
Figure 13:
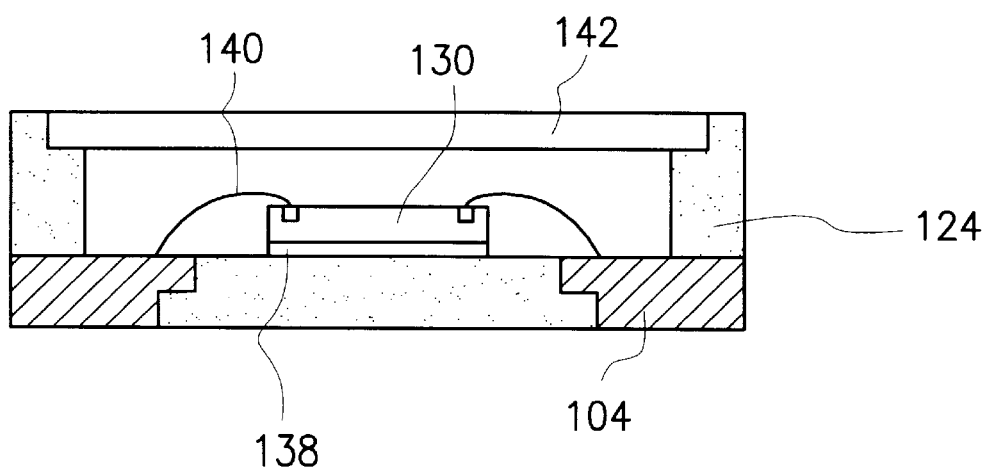
FIG. 13 shows a lead frame design without die pad according to the invention.

In additions, the die pad on the lead frame can have various kinds of design in accordance with the product requirements. FIG. 11 and FIG. 12 show another die pad design of a lead frame of a leadless image sensor package according to the invention. In order to improve the thermal stress effect between the chip and the die pad, the die pad 702 can be designed to have its area smaller than that of the chip 130 as shown in Fig. 11. Similarly, the die pad 802 can be designed in annular array disposition surrounding the chip 130 as shown in FIG. 12. Furthermore, the package of the invention can even be designed as an one without die pad. FIG. 13 shows a lead frame design without die pad according to the invention. As shown in FIG. 13, a lead frame is constituted only of the leads 104 surrounding the chip 130 at its periphery wherein the chip 130 is attached directly to the surface of the bottom portion of the molding compound 124. All the foregoing three kinds of design variation depicted in the embodiments can make use of the same tools for performing packaging, thereby, no extra cost is added. And those tools can be modified to fit various requirements of the product so as to increase the reliability of the product.

To summarize the foregoing illustration that is disclosed by preferred embodiments of the invention, the image sensor package structure and method for making the same includes at least the following advantages:

1. The leadless image sensor package structure of the invention can reduce the size of the package, thereby, increase the package density.
2. The leadless image sensor package structure of the invention that uses lead frame and molding compound to form the carrier can significantly lower the cost of product.
3. The method for making the leadless image sensor package structure can simplify the fabrication process, thereby, can increase the yield, and since the package unit can be disposed in an array, the package structure is appropriate for mass production to lower the cost.
4. The method for making the leadless image sensor package structure that uses the top and bottom molds to clamp the chip and the wire-bonding portion at the same in the molding process can improve the process yield of the chip attachment and wire-bonding. The method can also avoid the extra cleaning process due to the "flash phenomenon", thereby, simplify the fabrication process.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A leadless image sensor package comprising:
   a lead frame, having a die pad and a plurality of leads disposed at the periphery of the lead frame wherein the die pad has a top surface and a bottom surface and each of the leads has a wire-bonding portion, the lead frame also comprises a first surface and a corresponding second surface, step-like structures are formed at the wire-bonding portion of the leads and at the periphery of the die pad;
   a molding compound, disposed on the first surface of the lead frame and surrounding the outer edge of the lead frame, filling a clearance between the die pad and the wire-bonding portion of the leads, exposing the wire-bonding portion of the leads on the first surface, and forming a "chip containing space" by combining together with the lead frame;
   a chip, having an active surface and a corresponding back surface wherein the active surface has a plurality of bonding pads, and the chip is set in the "chip containing space" with the back surface of the chip attached to the top surface of the die pad;
   a plurality of wire, electrically connected respectively to the bonding pads and the first surface of the wire-bonding portion; and
   a transparent lid, disposed on the active surface to seal the "chip containing space".

2. The leadless image sensor package of claim 1, wherein the top surface of the die pad is larger than the bottom surface of the die pad so that bonding ability between the molding compound and the step-like structures of the die pad and the leads is improved.

3. The leadless image sensor package of claim 1 wherein a thickness of the die pad is smaller than a thickness of the leads such that the molding compound covers the bottom surface of the die pad.

4. The leadless image sensor package of claim 1 wherein the area of the die pad is small than the area of the chip.

5. The leadless image sensor package of claim 1 wherein the die pad appears to be an annular structure surrounding the chip and disposing at the periphery of the chip.

6. The leadless image sensor package of claim 1 wherein the molding compound includes epoxy.

7. The leadless image sensor package of claim 1 wherein the transparent lid includes a transparent glass plate disposed on the top of the "chip containing space" and fixed to the molding compound.

8. The leadless image sensor package of claim 1 wherein the transparent lid includes a transparent plastic plate disposed on the top of the "chip containing space" and fixed to the molding compound.

9. The leadless image sensor package of claim 1 wherein the transparent lid is formed by the use of a transparent liquid material by filling in the "chip containing space" and going through a curing process.

10. A leadless image sensor package comprising:

a lead frame, having a plurality of leads disposed in annular array at the periphery of the lead frame wherein each of the leads has a wire-bonding portion, and the lead frame also comprises a first surface and a corresponding second surface;

a molding compound, disposed on the first surface of the lead frame and being surrounding the outer edge of the lead frame, filling the clearance between the leads, exposing the wire-bonding portion of the leads on the first surface, and forming a chip containing space by combining together with the lead frame;

a chip, having an active surface and the corresponding back surface wherein the active surface has a plurality of bonding pads, and the chip is set in the "chip containing space" with the back surface of the chip attached to the molding compound at the bottom of the "chip containing space";

a plurality of wire, electrically connected respectively to the bonding pads and the first surface of the wire-bonding portion of the leads; and a transparent lid, disposed on the active surface to seal the "chip containing space".

11. The leadless image sensor package of claim 10 wherein, on the second surface, a stepped structure is built at the periphery of the wire-bonding portion of the leads and of the die pad such that the molding compound covers a portion of the surface of the wire-bonding portion on the second surface.

12. The leadless image sensor package of claim 10 wherein the molding compound includes epoxy.

13. The leadless image sensor package of claim 10 wherein the transparent lid includes a transparent glass plate disposed on the top of the "chip containing space" and fixed to the molding compound.

14. The leadless image sensor package of claim 10 wherein the transparent lid includes a transparent plastic plate disposed on the top of the "chip containing space" and fixed to the molding compound.

15. The leadless image sensor package of claim 10 wherein the transparent lid is formed by the use of a transparent liquid material by filling in the "chip containing space" and going through a curing process.

* * * * *